United States Patent [19]

Stock

[11] 4,280,138

[45] Jul. 21, 1981

[54] FRAME PERIOD TIMING GENERATOR FOR RASTER SCAN

[75] Inventor: Rodney D. Stock, Palo Alto, Calif.

[73] Assignee: Ampex Corporation, Redwood City, Calif.

[21] Appl. No.: 139,332

[22] Filed: Apr. 11, 1980

[51] Int. Cl.[3] ........................ H04N 5/06; H04N 9/46; G06F 1/04; H03K 5/04; H03K 5/13

[52] U.S. Cl. ...................................... 358/150; 358/19; 358/149; 364/900; 307/265; 307/269; 328/58; 328/63

[58] Field of Search ................. 358/149, 150, 19, 148, 358/152; 307/265, 269; 328/58, 63, 130, 179, 187; 364/514, 515, 900; 340/750

*Primary Examiner*—John C. Martin

*Attorney, Agent, or Firm*—Robert G. Clay

[57] ABSTRACT

A high frequency, high resolution programmable timing signal generator provides periodic timing signals during a time period which is long with respect to the time resolution of the generator. The timing signal generator which is particularly applicable for generation of the composite sync signal (and numerous related signals) for a video television signal, includes a small, high speed random access memory wherein each word corresponds to a timing state and each output bit provides a sync video related signal. Other memory bit outputs operate in conjunction with control and timing circuitry to sequentially address the memory while permitting the memory to remain in a given state for predetermined time durations and to cyclically repeat selected state sequences. Memory word compaction is thus facilitated to permit the use of small, fast memories to provide precision implementation of complex timing functions over relatively long frame period intervals with wide flexibility.

16 Claims, 3 Drawing Figures

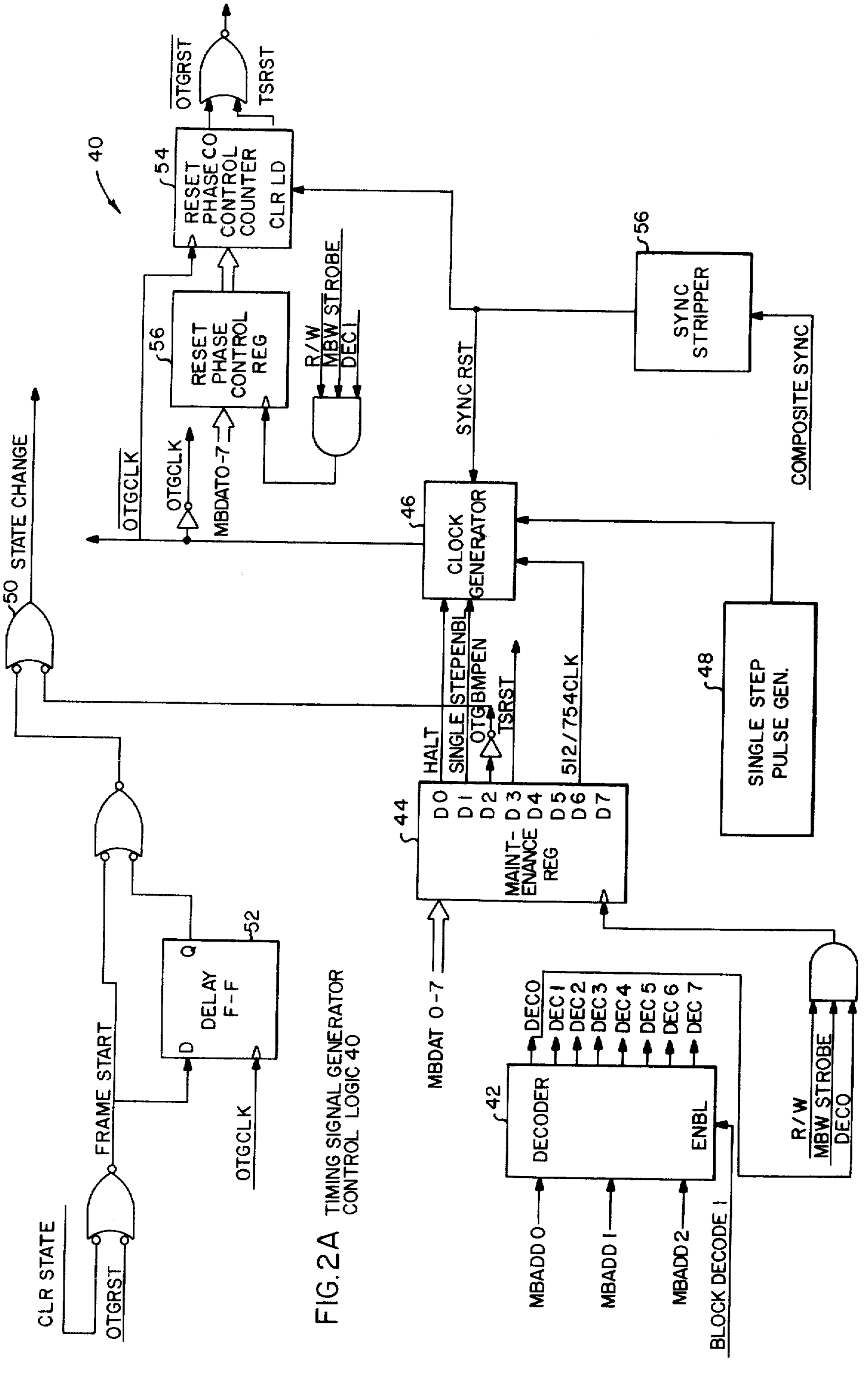
FIG.2A TIMING SIGNAL GENERATOR CONTROL LOGIC 40

TIMING SIGNAL GENERATOR
26-DATA LOGIC 70

FRAME PERIOD TIMING GENERATOR FOR RASTER SCAN

BACKGROUND OF THE INVENTION

1. Field of the Invention

This invention relates to high precision timing signal generators and more particularly to a timing signal generator which can meet the stringent requirements for a video composite sync signal for commercial television by providing a complex, high resolution signal over a frame period which is extremely long compared to the resolution of the signal.

2. Background of the Invention

The video component of a standard NTSC or PAL television signal contains precisely specified timing information called composite sync in addition to the actual video information. This composite sync signal controls such features as horizontal and vertical synchronization, horizontal and vertical retrace, and intensity level. Well established standards place stringent demands on the composite sync signal. It must provide precise, periodic timing relationships while complying with extremely close frequency tolerances. This places similar constraints on many signals related to composite SYNC. While it has long been known to provide inexpensive timers such as counters responsive to clock signals for many purposes, the demands of various standardized composite sync and related video signals have been too stringent and disparate to permit the use of these simple timing mechanisms to generate the composite sync signal. Consequently, it has been necessary to sacrifice flexibility and multiple output capability when utilizing analog based circuitry such as crystal controlled oscillators to meet the tolerance and high frequency requirements of the signals.

SUMMARY OF THE INVENTION

A high speed timing signal generator providing precision temporal control of a video timing signal for a video component of a raster scan television signal includes a digital memory or store, a source of a periodic clock signal, a state duration counter, a sequence cycle counter, an address store or register, an address counter, and control circuitry. The store contains an ordered succession of addressable word locations, each storing selected data corresponding to a timing generator state, and has store outputs responsive to data stored at the addressable word locations. The store provides information indicating the state of the various video signals, information indicating a number of clock cycles during which a corresponding word location is to be addressed, information indicating boundaries between adjacent sequences of word locations, and information indicating a number of times a sequence of word locations is to be repeated before a next sequence of address locations is to be addressed. The state duration counter is coupled to receive time duration information indicating a number of clock cycles each time a word location is addressed as well as the clock signal. The duration counter is arranged to step toward a predetermined state such as all ones each time a clock signal pulse is received. The sequence cycle counter is coupled to receive a number indicating a number of times a sequence of states is to be executed each time a new sequence of address locations is addressed and to step toward a predetermind state each time the addressing from a sequence of word locations is repeated.

The address store is coupled to receive and store a first address of a sequence of addresses in response to address store load commands and the address counter is coupled to address the store in accordance with a current address count state, to receive an address count state from the address store in response to a counter load command and to step the address count state to a successive address count state in response to a step command. The control circuitry is coupled to respond to the boundary information, the state of the state duration counter and the state of the sequence cycle counter by generating an address stored load command causing the address stored to receive from the address counter and store the address of a first word location in a sequence each time a boundary between adjacent sequences of word locations is crossed and each time the state duration counter reaches its predetermind state. In this state, if the sequence cycle counter has reached its predetermined state or a sequence boundary is not indicated by the boundary information and the control circuitry generates an address counter step command and, if the sequence cycle counter has not reached its predetermind state and the boundary information indicates that the stepping of the address counter will cause a crossover into a next sequence of word locations, the control circuitry generates an address counter load command. The data stored by the store is selected to cause information indicating the state of the video composite sync signal (and other signals) to generate a desired signal pattern as the store is addressed by the address counter.

The timing signal generator may generate any desired control signal patterns in addition to the composite sync signal. These control signal patterns may be advantageously utilized in circuitry which generates, processes or displays the video signal. In accordance with the invention, each successive combination of control signals, including the composite sync video signal is assigned successive states and a word is provided in the memory for each state. The built-in flexibility of the timing generator permits word information to define a time interval for each of these states so that each state may last for a defined time interval ranging from a single clock pulse cycle to many clock pulse cycles. Furthermore, a plurality of states or memory word locations may be grouped together into a sequence which may be repeated a number of times specified by a word location in the memory such as the first word location following a border transition from one sequence to a next sequence. This technique is extremely powerful where relatively large numbers of repeating subcycles occur such as during the horizontal scanning of the video portion of a raster scan television signal. By allowing one address location or count state to remain for a specified duration and by permitting sequences of counts of states to be repeated, the store size may be quite small while providing high precision, complex signal states over relatively long repeating period time durations. The resulting small size of the store permits extremely fast access time thereby facilitating high resolution.

In one example of a timing signal generator for generating the composite sync video signal for an NTSC television signal utilizing 525 scan lines (512 visible) and 910 separate display elements or pixels per scan (768 visible) the basic clock signal occurs at a period of approximately 70 nanoseconds. However, the timing generator system is capable of even higher resolutions with clock pulse periods as short as 56 nanoseconds to meet the requirements of European broadcasting formats. The 70 nanosecond clock pulses provide a resolution of 1 part in U.S. Pat. No. 4,754,750 over a 1/30 of a second frame time interval.

BRIEF DESCRIPTION OF THE DRAWINGS

A better understanding of the invention may be had from a consideration of the following Detaild Description, taken in conjunction with the accompanying drawings, in which:

FIGS. 2A and 2B are schematic and block diagram representations of a timing signal generator in accordance with the invention.

DETAILED DESCRIPTION

Figure 1:
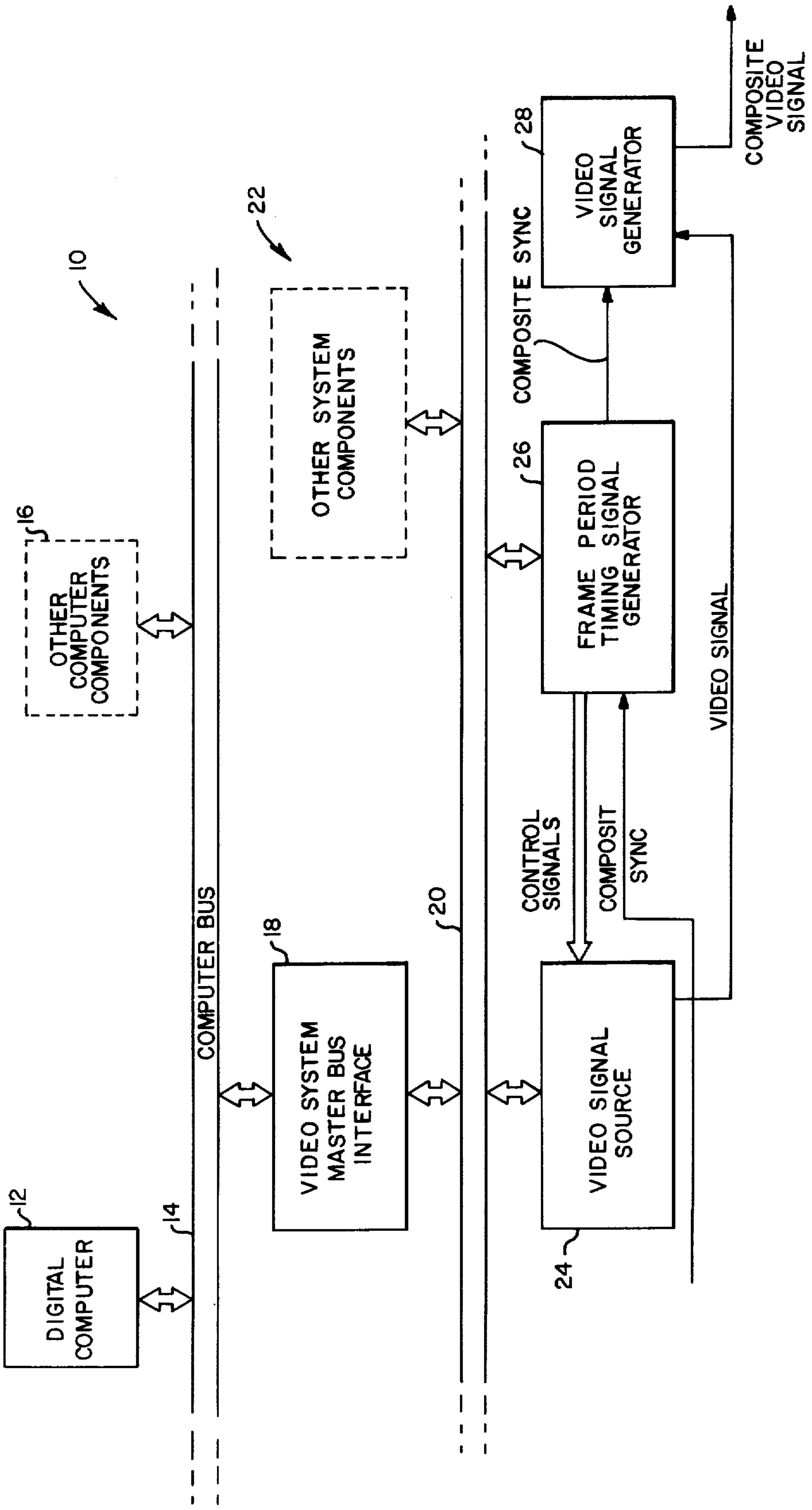
FIG. 1 is a block diagram representation of a computer graphics system connected to a timing signal generator in accordance with the invention.

Referring now to FIG. 1, a raster scan computer graphics system 10 includes a digital computer 12 such as a DEC 11/34 connected to a computer bus 14. Other computer components 16 such as disk drives, tape drives, and IO communication devices have not been explicitly shown but may also be connected to the computer bus in a conventional manner. A video system Master Bus interface 18 provides connection between the computer bus 14 and a Master Bus 20 for the video portion 22 of the computer graphics system 10. The video system Master Bus interface 18 permits the Master Bus 20 to appear as an extension of the computer bus 14 so that register and other storage locations within the video portion 22 may be directly addressable by the digital computer 12 and other components on the computer bus 14.

Connected to the Master Bus 20 are a video signal source 24, a frame period timing signal generator 26, and a video signal generator 28. The video signal source 24 may in general by any source of video signals such as a television camera but in a preferred embodiment is implemented as a frame store for the computer graphics system 10. A frame store stores a frame of a video signal as an array of pixels or picture elements having 910 pixels per row and 525 rows. It will be appreciated that the visible portion of such an array is actually 754 pixels in each of 485 lines. Each pixel location stores the required video display information for a single display point or dot.

FIG. 1 represents the computer graphics system 10 in generalized form with the video signal source 24 providing a video information signal to the video signal generator 28 and a composite sync signal to frame period timing signal generator 26. In return, the frame period timing signal generator provides a composite sync signal to the video signal generator 28 and returns various control signals to the video signal source 24. Flexible construction of the frame period timing signal generator 26 permits the composite sync signal from the video signal source 24 to be an actual composite sync signal to which the timing signal generator 26 synchronizes as in the case when the video signal source 24 is a conventional television camera. The composite sync signal from video signal source 24 may also be a simple frame synchronizing clock signal at the 30 frames per second rate of the video signal to provide synchronization with the video signal source 24. Alternatively, the frame period timing signal generator 26 is capable of operating in response to its own internal clock signals without synchronization to a video signal source 24. In this case, the control signals would permit the video signal source 24 to be synchronized to the timing signal generator 26 rather than vice versa. The video signal generator 28 receives the video signal as well as the composite sync signal from timing signal generator 26 and any other necessary signals to generate a conventional composite video signal as an output.

Figure 2B:
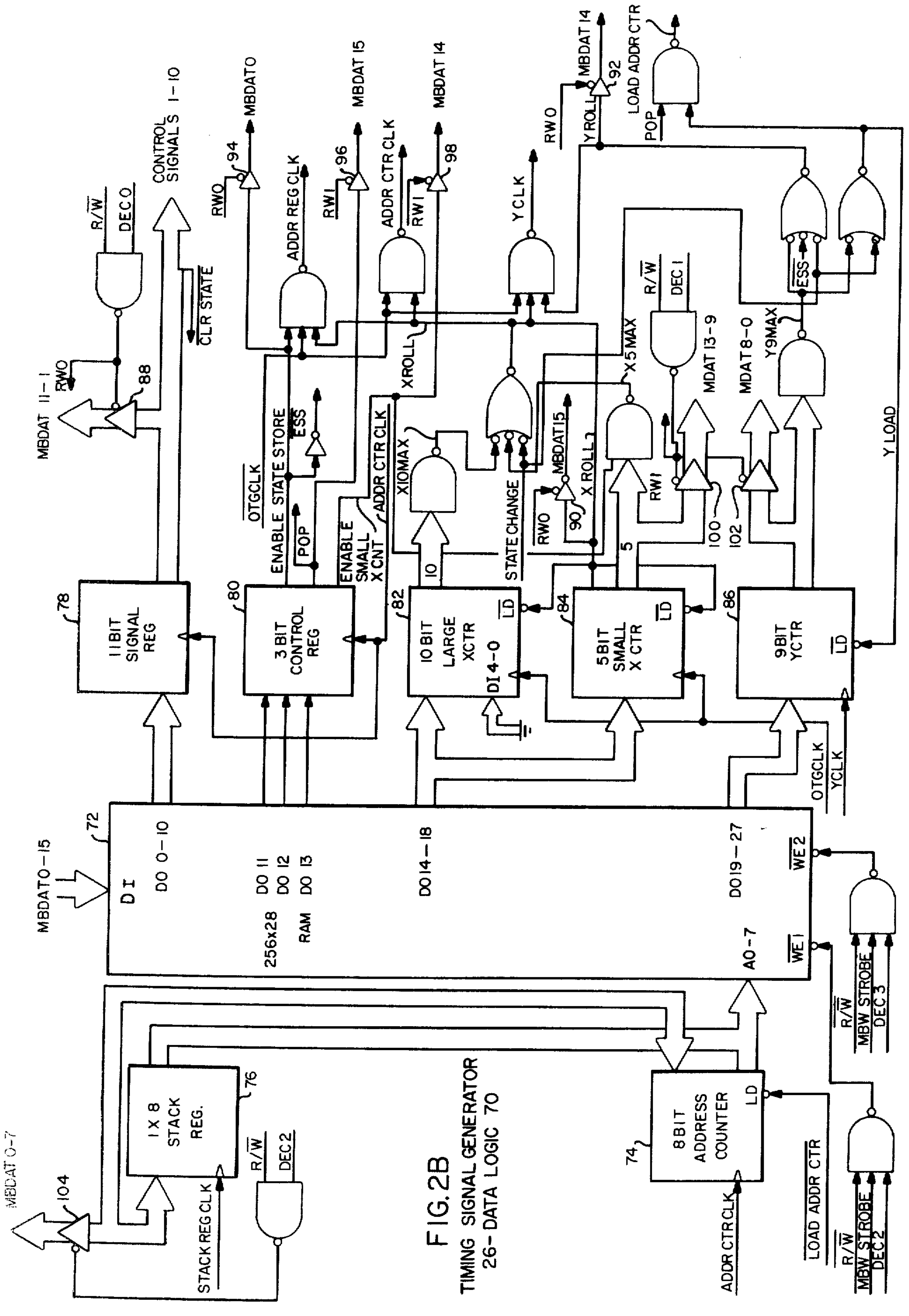

The frame period timing signal generator 26 is shown in greater detail in FIG. 2A and FIG. 2B. FIG. 2A shows the control logic portion 40 of the timing signal generator 26 and includes a Master Bus address decoder 42. Address decoder 42 receives a block decode enable signal as well as three Master Bus address signals to generate one of eight decoded outputs when enabled by the block decode signal. The block decode signal is generated elsewhere in the video portion 22 of the graphics system 10 by decoding more significant bits of the memory bus address signal to select the timing signal generator 26 from other portions of the graphics system.

A maintenance register 44 is connected to receive Master Bus data bits 0–7 when addressed through the Master Bus 20. The maintenance register 44 provides a mechanism through which computer 12 may assert control over the operation of the timing signal generator 26. By loading a "one" into storage location D0 a clock generator 46 may be caused to halt and cease generating its elemental clock signal pulses designated OTGCLK at the elemental pixel rate having a period of approximately 70 nanoseconds. The loading of a "one" into location D1 of maintenance register 44 generates a single step enable output signal which causes clock generator 46 to output a clock pulse only in response to an input pulse from single step pulse generator 48. The single step pulse generator 48 may be implemented in a number of ways but is advantageously implemented to generate a pulse signal for each addressable read or write operation on the Master Bus 20 under single step conditions.

A NAND gate 50 generates a state change signal in response to a signal OTGBMPEN which may be stored at location D2 in maintenance register 44 and also in response to a pair of reset commands which cause the timing signal generator 26 to reset to the beginning of a frame period. A signal $\overline{\text{CLRSTATE}}$ is generated internally by the timing signal generator 26 at the end of every frame signal period to cause the timing signal generator 26 to automatically initiate a new frame signal period in the absence of any external synchronization control. Alternatively, a signal $\overline{\text{OTGRST}}$ which is generated in response to external synchronization signals may also be utilized to cause the timing signal generator 26 to return to a frame start initialization condition. A delay flip-flop 52 is utilized to assure that the state change signal lasts for two clock pulse periods. In order to achieve adequately fast operating speed and time resolution the signal generator 26 must utilize a memory having an access time which is only slightly shorter than the period of pulses from the elemental clock signal OTGCLK. Consequently, in order to assure proper addressing of the memory, a next state or word location must be addressed while a current state or word location is being executed. The two count delay implemented by delay flip-flop 52 assures that as soon as the memory is reset to address zero a second clock pulse will increment the address counter 74 to state one while address state zero is being latched and executed. The state change signal operates to override other system control signals and assure that memory addresses will be incremented in response to clock pulse signals. The OTGBMPEN signal from the maintenance register 44 thus permits the digital computer 12 to sequentially access the memory to read its output for maintenance purposes or to write data therein to reprogram the frame period timing signal generator 26. Location D3 of the maintenance register 44 may also be loaded under digital computer control to generate an OTGRST reset signal to command computerized return to address location zero which specifies the beginning of a frame period for the frame period timing signal generator 26.

The OTGRST reset signal is generated in response to a timing state reset signal from a D3 output of maintenance register 44 or from the C0 impending overflow output from reset phase control counter 54. Reset phase control counter 54 is an eight bit binary counter which is loaded in response to a sync reset command from sync stripper 56. Sync stripper 56 filters or otherwise removes all information except frame syncronization information from the composite sync signal generated by video signal source 24 as shown in FIG. 1. In the event that the composite sync signal contains no information other than frame sync information the frame sync information is simply passed through to the load input to reset phase control counter 54.

A reset phase control register 57 is an eight bit binary register which may be addressably written into by the digital computer 12 through the computer bus 14 and the Master Bus 20. Upon receipt of a SYNCRST signal from sync stripper 56, the reset phase control counter 54 is caused to load the contents of reset phase control register 57. The number of counts between the generation of the external synchronization signal and the actual generation of the internal OTGRST signal and hence the phase of the timing signals generated by timing signal generator 26 may thus be controlled by digital computer 12. This arrangement permits synchronization control to accommodate cable delays between the timing signal generator 26 and video signal generator 28 by merely controlling a number loaded into reset phase control register 57 with no requirement for hardware changes or adjustments.

As shown in FIG. 2B, the data logic portion 70 of timing signal generator 26 includes a store 72 which is implemented as a high speed random access memory having 256 words of 28 bits each. Store 72 is addressed in response to an 8 bit address counter 74 which in turn may be loaded from a one word by 8 bit stack register 76 which in turn may be loaded with the output of address counter 74. Stack register 76 stores the first address of each new sequence of addressable states which are accessed by store 72 to permit sequences of addressable states to be repeated.

An 11 bit signal register 78 receives and stores data outputs D0 0–10 from store 72. These signal outputs include the composite sync signal which is one of several desired end products of the timing signal generator 26, the signal $\overline{\text{CLRSTATE}}$ which commands the timing signal generator 26 to automatically reset to an initial start state at the conclusion of a frame period, and various other control timing signals which are advantageously used by the video portion 22 of the graphics system 10. These additional signals may include signals such as vertical interval, even field, start vertical interval, video blanking, fill video signal pipeline, analog clamp, input video valid, and burst flag in addition to the composite sync and $\overline{\text{CLRSTATE}}$ signals mentioned previously.

A three bit control register 80 receives and latches data outputs D011, D012 and D013. These three signals include an enable state store signal (ESS) which identifies the last state or address of a sequence of states and commands the stack register to load from the address counter the first address of the next sequence when all repeats of the current sequence have been completed, a pop signal which commands the address counter 74 to be loaded from the stack register 76 at the end of a sequence when a sequence is to be repeated, and an enable small X counter signal (ESXCNT) which selects between a five bit state duration counter for short state duration intervals and a 10 bit state duration counter for long state duration intervals.

A 10 bit large X counter 82 and a 5 bit small X counter 84 are both coupled to have their five most significant bits latched in response to data outputs D0 14–18 from store 72. These counters, one of which is selected by the enable small X count output from register 80, control the time duration for each address state of store 72. The five least significant bits of large X counter 82 are always loaded with all zeros. Consequently, the large X counter 82 will at the soonest reach its maximum count at the same time as small X counter 84. Consequently, it is unnecessary to disable large X counter 82 and the first counter to reach its maximum count control system operation. This will always be the small X counter unless it is initially loaded with a count of zero, in which case both the small X counter 84 and large X counter 82 will reach the count states at the same time. When it is desired to provide a short delay of 32 clock pulses or less for a given state, the desired delay is loaded into small X counter 84 which is in turn enabled by the enable small X counter signal from register 80. For larger delays, a given state is divided into two address states for which the output control and data signals are identical. However, in the first word the X count data bits D0 14–18 indicate the maximum integral number of clock pulse intervals which can be defined by the most significant five bits of a 10 bit binary number. The second word contains five data outputs D0 14–18 the X count defining the five bit remainder of the state duration interval. As the first word is executed the enable small X counter signal from the control register 80 disables the small X counter 84 to permit the large X counter 82 to control the time duration of the addressable word state. During the second word the enable small X counter signal from control register 80 enables small X counter 84 to produce the remainder of the desired state interval time duration. It will be appreciated that separate data counts could be provided for the large and small X counters 82, 84, but this would require five additional data bits for store 72. In fact, by using ten X count data bits, the small X counter could be eliminated with the total count duration being defined completely by the ten bits of large X counter 82. It will be appreciated that cost as well as the requirement for high speed operation dictate the use of as small a store 72 as possible and that the use of a double enabled counter technique permits the number of bits per word to be reduced by five with only a small increase in the number of words.

A Y counter 86 is a nine bit counter which is loaded from data bits D0 19–27 to control the number of repeats for each sequence of memory states. The Y counter is loaded with information indicating the number of repeats in response to the ESS signal each time a border is crossed from one sequence of states to a next sequence of states. Unless the Y counter 86 has reached its maximum count, a pop data bit stored in the last word position of a sequence causes the address counter to be loaded from the stack register so that address control returns to the first address of the sequence. Each time a repeat occurs the Y counter is incremented towards its maximum count and upon reaching its maximum count it inhibits this pop operation to cause control to pass to the first state of the next sequence of count states.

Four read words and three write words of 16 bits each are provided for the digital computer 12 for accessing the data logic portion 70 of timing signal generator 26 over computer bus 14 and Master Bus 20. The first write word, which is decoded as output 2 from address decoder 42 permits the writing of data from the 16 bit data bus MBDAT to be written into bit positions 0–15 of store 72. The second write word which is decoded as output 3 from decoder 42 permits the writing of data into bit positions 16–27 of data store 72. The word within data store 72 into which this data is written is selected by the contents of address counter 74. The maintenance register is assigned one of the read write addresses. It will be recalled from prior discussion that the computer 12 can control the word selection of address counter 74 by first resetting address counter 74 and then incrementing address counter 74 through the single step pulse generator 48 each time a word is written into store 72. The first read word is decoded by decoder 42 as output DEC0 and causes the outputs of signal register 78 to be placed on the memory data bus line MBDAT 11–1 through tristate buffer 88. Tristate buffers 90 and 92 cause internal signals designated X roll and Y roll to be placed upon bit positions 15 and 14 respectively of the memory data bus in response to the read word zero address selection. A tristate buffer 94 causes the control signal enable state store (ESS) to be placed on bit zero of the Master Bus data bus in response to the addressing of read word zero. The addressing of read word one causes tristate buffers 96 and 98 to output signals pop and enable small X count (ESXC) to be placed on bit positions 15 and 14 respectively of the Master Bus data lines. The X count is communicated through tristate buffer 100 to Master Bus data lines 13–9 and the Y count is communicated through tristate buffer 102 to bit positions 8–0 of the Master Bus data lines in response to a read word one address command. The third read word causes decoder 42 to energize output DEC2 and enable a tristate buffer 104 to place the contents of address counter 74 on data lines 0–7 of the memory data bus 20.

The address counter 74, 11 bit signal register 78, and 3 bit control register 80 are all clocked by the same signal designated $\overline{\text{LOADADDRCTR}}$. This signal has the logical function ADDR CTR CLK=OTGCLK+$\overline{\text{X10MAX·X5MAX·OTGBMPEN·FRAME START·FRAME START D}}$. These registers are thus clocked by the elemental clocking signal OTGCLK unless the clocking is disabled by one of the other terms in the function. The address counter load signal input has the logical function ADDR CTR LOAD=POP·$\overline{\text{(Y9MAX+OTGBMPEN+FRAME START+FRAME START D)}}$. This signal thus causes the contents of the stack register 76 to be loaded into the address counter 74 wherever the pop output from store 72 indicates the end of a sequence of states unless the signal is disabled by the Y counter 86 reaching a maximum count or the presence of one of the other control signals. The clock input of stack register 76 has the logical function STACK REG CLK=OTGCLK+$\overline{\text{ESS}}$+$\overline{\text{(X10MAX·X5MAX·OTGBMPEN·FRAME START·FRAME START D)}}$. The stack register is thus clocked by the elemental clock signal when enabled by signal ESS unless disabled by one of the other terms in the function. It will be noted that at the last clock pulse of a state duration time interval the signal X10MAX or, if enabled, signal X5MAX will go true to enable the stack register clock signal. The load signal for the X counters 82 and 84 have the logical function

X LOAD=X10MAX+X5MAX+OTGBMPEN+FRAME START+FRAME START D.

The occurrence of a maximum X count or an externally controlled condition thus causes the X counters to be reloaded. The X counters are clocked simply by the elemental clock signal OTGCLK. The Y counter 86 is loaded when it reaches maximum count in a manner similar to the X counter in response to the signal Y LOAD=Y9MAX+OTGBMPEN+FRAME START+FRAME START D. Y counter 86 is clocked by signal Y CLK=OTGCLK+$\overline{\text{X10MAX·X5MAX·OTGBMPEN. FRAME START·FRAME START D}}$+$\overline{\text{ESS·Y9MAX·OTGBMPEN·FRAME START·FRAME START D}}$. The Y counter is thus clocked during normal operation by the elemental clock signal OTGCLK when enabled by the occurrence of a maximum X count in a selected X counter and, the occurrence of a maximum Y count or the occurrence of the output state signal ESS.

The address counter 74, ten bit large X counter 82, five bit small X counter 84, and nine bit Y counter 86 may all be implemented with binary synchronous counter circuits which are available from a number of sources under the designation S163. The stack register 76 is available under the designation S374 and the registers 78 and 80 are available under the designation LS244.

An actual program defining the contents of store 72 for one application is defined in shorthand notation in Table I to which reference is now made. The first several lines in Table I merely define terms which are to be incorporated by reference into the program itself which begins with the designation "START PROGRAM". In the shorthand notation utilized in Table I each set of parentheses defines a sequence of count states. Semicolons separate parallel terms within a count state or a sequence of count states and commas indicate concatenation or serial separation between address states or sequences of address states. All output signals remain unchanged unless a change is specifically indicated. The term $\overline{\text{CLRSTATE}}$ as utilized in FIG. 2B is designated SELFRST in Table I. A number appearing at the close of a set of parentheses indicates the number of times that a sequence is to be executed. Once is assumed in the absence of a different designation. The actual X counts and Y counts are stored as the 2's complement of the desired execution times or pulse count durations.

Looking now at Table I, the first line defines a sequence which is to last for 672 clock pulses as indicated by "672C" and defines the initial states of the 11 timing signals which are stored by signal register 78.

The data content for the bit locations corresponding to the three bit control register 80, the large X counter 82, the small X counter 84 and the nine bit Y counter 86 are not shown explicitly in Table 1 but can be derived from information contained therein. For example, the first sequence is a one state sequence which can be implemented with a single address word location at address zero. Since the sequence is to be executed only once, the 2's complement of one or max count is placed in the Y counter locations and the 2's complement of 672 divided by 32 equal 21 is placed in the X counter bit positions of word zero and a zero is placed in the enable small count bit position for word zero, thus enabling the large X counter 82 to control the timing operation. If there had been a remainder, the 2's complement thereof would have been positioned at the next word location to load the small X counter for completion of the single state sequence. The next term of the Table incorporates by reference the previously defined term "VSTRT". This term defines a sequence which is to be executed only once and to last for 910 clock pulses. It is noted that 910 clock pulses correspond to a single horizontal scan time interval, including retrace. It should be noted that there is a change of output states for the VSTRT term. For example, the COMPSYNC term, which was previously "one", is changed to "zero". The colon followed by "**68C,*;**" indicates that the composite sync signal is to remain in the "zero" state for 68 counts and change back to "one" after 68 counts. The * means that it will remain in the "one" state then for the remainder of the 910 count sequence. Similarly, the burst signal which was at "zero" for the first word state will remain at "zero" for the first 76 counts, change to "one" for the next 36 counts, and then return to "zero" for the remainder of the 910 count sequence. Similarly, signal VSTRT changes from "one" to "zero" at the beginning of the second sequence, remains at "zero" for 89 counts and then returns to logic "one" for the remainder of the sequence. The next item of the state program is the defined term HLOOPA which is another 910 count sequence which is repeated six times. It will be appreciated that by defining the specific program with the count states for each signal and the number of execution cycles, the contents of the store 72 can be properly loaded with the X count and Y count signals as well as the enable state store, pop and enable small X count signals to properly identify sequence boundaries and control the repeating of state sequences as well as the loading of the stack register 76 at the transition across the boundary of one state sequence to a next state sequence.

The last two lines of the state program are of special interest. It will be noted that the term SLFRST is set to one at the beginning of the program and continued in this state until the next to the last line of the program. It will be further noted that the last two lines are both two count sequences and that the last line is a repeat of the next to the last line. In the absence of an external frame reset command, the next to the last line generates an automatic reset through the term SELFRST. It will be recalled from previous discussion that the reset operation is a two clock cycle operation. Hence, the last operation is defined as a two clock pulse single state sequence. It will be recalled that the address counter must always remain one count ahead of the currently executed address state in order to accommodate the speed requirements of the system. Hence, as the data for the next to the last state of a frame period is loaded into the registers and counters, the address counter 74 is incremented to address the last state (corresponding to the next to the last line of the program). The next elemental clock pulse OTGLCK will cause the last state data to be loaded into the registers and the address counter to be incremented to point to the last state plus one (corresponding to the last line of the program). This is the beginning of the two count reset process. The first count will cause the data contents of the last state plus one word location to be loaded into the data output registers while the address counter is reset to zero. The second clock pulse of the two clock sequence causes the data stored at address location zero to be loaded into the data registers for execution of state zero while the address counter is incremented to count one. This completes the two count reset sequence. It will be appreciated that if a separate 70 nanosecond state were required for the last state of a frame period (count two of the reset interval) different data could be specified at the last or extra line of the program. However, it is convenient to define the last or reset state as a two count sequence and merely repeat the sequence as the last line of the program.

While there has been described above a particular arrangement of a computer graphics system having an advantageous frame period timing signal generator for the purpose of enabling a person of ordinary skill in the art to make and use the invention, it will be appreciated that the invention is not limited thereto. Accordingly, any modifications, variations or equivalent arrangements within the scope of the attached claims should be considered to be within the scope of the invention.

TABLE I

DEFINITIONS

```
vloopa = (455C/vint = 1; compsync = 0:34C,*)5
vloopb = (455C/compsync = 0:389C,*)6
  vstrt = (910C/compsync = 0:68C,*; burst = 0:76C,36C,*; vstart = 0:89C,*)
hloopa = (910C/compsync = 0:68C,*; burst = 0:76C,36C,*; analosclr = 0:7C,61C,*)6
hloopb = (910C/vint = 0; compsync = 0:68C,*; analosclr = 0:7C,61C,*; vidval = 0:141C,758C,*;
    blank = 1:131C,754C,*; burst = 0:76C,36C,*; fillpipe = 0:121C,762C,*;
    spare = 0:131C,754C,*)242
```

START PROGRAM

```
(672C/analosclr = 0; fillpipe = 0; vidval = 0; blank = 1; vstart = 1; evenfield = 0; vint = 1;
    compsync = 1; selfrst = 1; burst = 0; spare = 0),
vstrt,
hloopa,hloopb,
(455C/compsync = 0:68C,*; vidval = 0:141C,302C,*; blank = 1:131C,298C,*;
    fillpipe = 0:121C,306C,*; spare = 0:131C,298C,*),
(455C/evenfield = 1; compsync = 0:34C,*),
```

TABLE I-continued

```
vloopa,vloopb,vloopa,
(910C/compsync = 0:34C,*),
(910C/compsync = 0:68C,*; burst = 0:76C,36C,*)3,
vstrt,
hloopa,
(910C/vint = 0; compsync = 0:68C,*; vidval = 0:141C,758C,*; blank = 1:430C,455C,*;
    burst = 0:76C,36C,*; fillpipe = 0:121C,762C,*; spare = 0:430C,455C,*),
hloopb,
(455C/evenfield = 0; compsync = 0:34C,*),
vloopa,vloopb,
(455C/compsync = 0:34C,*)6,
(910C/compsync = 0:68C,*; burst = 0:76C,36C,*)3,
(239C/compsync = 0:68C,*; burst = 0:76C,36C,*),
(2C/compsync = 1; selfrst = 0),
(2C/compsync = 1; selfrst = 0)
```

What is claimed is:

1. A high speed timing signal generator comprising:
an addressable, readable data store having a plurality of data outputs indicating data stored at corresponding bit positions of state defining addressed word locations, the data outputs including a plurality of timing signals and a plurality of state duration control outputs;
a clock signal source providing an elemental clock signal; and
address control circuitry coupled to receive the elemental clock signal and data from the state duration control outputs and address the readable store in response thereto to cause the timing signal generator to remain at a given state for a number of periods of the elemental clock signal indicated by the data from the state duration control outputs for an addressable location in the store corresponding to the prior address location.

2. A timing signal generator according to claim 1 above, wherein the data store further comprises outputs providing boundary information indicating state sequence boundaries defining sequences of addressable states and cycle count information indicating a number of times a sequence of states is to be executed and wherein the control circuitry further comprises an address stack register coupled to receive and store information indicating the address of a first state of a sequence of states being executed in response to the boundary information and a sequence repeat counter coupled to receive the cycle count information for a sequence of states in response to the boundary information and to cause each sequence of states to be executed a number of times indicated by the cycle count information.

3. The timing signal generator according to claim 1 above, further comprising:
a decoder coupled to selectively generate a plurality of decoded output signals in response to computer system address information and a plurality of gates selectively coupling timing signal generator status information and storage locations to a computer system data bus in response to the decoded output signals with status data being placed on a data bus in response to a computer system read command and being received from a data bus and stored in a timing generator storage location in response to a computer system write command.

4. The timing signal generator according to claim 3 above, wherein the address control circuitry includes an address counter coupled to addressably access the data store, the address counter being coupled to be reset in response to a selected output signal and to be incremented in response to data transfers over the computer system data bus, and wherein the data store is a writeable data store coupled to receive and store data from the computer system data bus in response to a selected decoder output signal, the data being stored at address locations accessed by the address counter.

5. The timing signal generator according to claim 1, 2 or 3 above further comprising data storage circuits coupled to receive and hold information from the data store outputs during each state and wherein the data store is being addressably accessed to provide information for a next timing state while a current state is being executed.

6. The timing signal generator according to claim 1, 2 or 3 above, wherein one of the outputs of the data store provides a composite sync signal component for a standard commercial television signal.

7. The timing signal generator according to claim 1, 2 or 3 above, further comprising first and second time duration counters coupled to receive in parallel state duration control output information from the data store and to be stepped toward a final count in response to the elemental clock signal, the first counter receiving the state duration control output information at more significant count locations than the first counter with predetermined information being loaded into less significant locations from a source independent of the data store, and wherein the data store provides for each state an output signal selecting either the first or the second duration counter to control the time duration of the state.

8. The timing signal generator according to claim 1, 2 or 3 above wherein the address control circuitry includes a reset circuit coupled to cause the addressing of a first word location in response to a reset signal and wherein the data store includes a reset output coupled to provide a reset signal to the reset circuit upon being addressed at a word location indicating a last word location of a sequence of state defining word locations to cause the timing generator to automatically periodically recycle to a first word location upon reaching a last word location indicating word location to produce the at least one timing signal as a periodically repetitive signal.

9. The timing signal generator according to claim 8 above, wherein the address counter circuitry addresses a word location next beyond a word location defining a currently executed state and the last word location indicating word address is a next to the last word address in a sequence of word addresses for word locations defining the at least one periodically repetitive timing signal.

10. A circuit for generating a composite sync video signal comprising:

an addressable, readable store having a plurality of data outputs controlled in response to data stored at corresponding bit positions in addressed word locations, the data outputs including a composite sync video signal output and a plurality of state duration control outputs;

a clock signal source providing an elemental clock signal; and address control circuitry coupled to receive the elemental clock signal and data from the state duration control outputs and address the readable store in response thereto to cause the readable store to remain at a given address location for a number of periods of the elemental clock signal indicated by the state duration control outputs for an addressable location in the store corresponding to the given address location.

11. A high speed timing generator providing precision temporal control of a video timing signal for a video component of a raster scan television signal, the timing generator comprising an addressable memory having a plurality of addressable storage locations each storing information defining a state of the video timing signal and information defining a time duration for a corresponding video timing signal state, the memory having outputs indicating a state of the video timing signal and time duration information for an addressed storage location and a memory address control circuit coupled to address a sequence of memory locations in response to the time duration output information with each location being maintained for a length of time defined by the time duration output information corresponding thereto to generate a video timing signal having desired state time duration characteristics.

12. A video composite sync signal generator comprising: an addressable randomly readable store having a plurality of addressable word locations, each storing predetermined multiple video composite sync signal data bits including a data bit, and a plurality of predetermined state count time data bits;

an elemental clock signal source generating a periodic elemental clock signal;

a state duration control counter coupled to be set in response to the state count time data bits for an accessed word location and to be stepped toward a predetermined count in response to the elemental clock signal; and an address circuit coupled to sequentially address the readable store and to step from one address location to another address location in a sequence in response to the state duration countrol counter reaching said predetermined count, the predetermined composite signal data words in the word locations accessed by the address circuit providing multiple video signals including a composite sync signal for the sync component of a standard television signal.

13. A video composite sync signal timing generator circuit comprising:

a store having an ordered succession of addressable word locations storing selected data and store outputs responsive to data stored at addressed word locations and providing information indicating a state of the video composite sync signal, information indicating a number of clock cycles during which a corresponding word location is to be addressed, information indicating boundaries between adjacent sequence of word locations, and information indicating a number of times a sequence of word locations is to be repeated before a next sequence of address locations is to be addressed;

a source of a clock signal having periodic pulses;

a state duration counter coupled to receive number of clock cycle information each time a word location is addressed and the clock signal, the duration counter being arranged to step toward a predetermined state each time a clock signal pulse is received;

a sequence cycle counter coupled to receive word sequence repeat number information each time a new sequence of address locations is addressed and to step toward a predetermined state each time the addressing of a sequence of word locations is repeated;

an address store coupled to receive and store a first address of a sequence of addresses in response to an address store load command; and an address counter coupled to address the store in accordance with a current address count state, to receive an address count state from the address store in response to a counter load command and to step the address count state to a successive address count state in response to a step command; and control circuitry coupled to respond to the boundary information, the state of the state duration counter and the state of the sequence cycle counter by generating an address store load command causing the address store to receive from the address counter and store the address of a first word location in a sequence each time a boundary between adjacent sequences of word locations is crossed and each time the state duration counter reaches its predetermined state, if the sequence cycle counter has reached its predetermined state or a sequence boundary is not indicated by the boundary information generating an address counter step command and if the sequence cycle counter has not reached its predetermined state and the boundary information indicates that the stepping of the address counter will cause a crossover into a next sequence of word locations, generating an address counter load command;

the data stored by the store being selected to cause the information indicating the state of the video composite sync signal to generate a desired signal pattern as the store is addressed by the address counter.

14. The method of generating a digital video timing signal for a raster scan television signal using an addressable store having an output defining the video timing signal and a plurality of outputs defining state durations for each state of the video timing signal comprising the steps of:

loading into the addressable store information defining successive states of the video timing signal in a sequence of address locations and time duration information defining the time duration for each of the successive states of the video timing signal; and sequentialy addressing the store to cause the store to output the successive states of the video timing signal with each state being maintained for a time duration indicated by the time duration information corresponding thereto.

15. The method of generating a digital video timing signal containing composite sync information for a raster scan video signal having at least one output defining the video signal, a plurality of state duration outputs having states defining the time duration of video timing signal states corresponding thereto, at least one boundary initiation output indicating boundaries between sequences of addressable words and at least one repeat number indicating output indicating a number of times a sequence of addressable words is to be repeated and using a repeat counter and an address store comprising the steps of:

sequentially addressing a plurality of sequential word locations in the store while the outputs of the store provide an output state corresponding to each address word location, each addressed word location being maintained for a time duration indicated by state duration outputs corresponding thereto;

detecting a boundary between one sequence of word locations and a next sequence of word locations in response to the at least one boundary indicating output; and if the repeat counter has not reached a state indicating that all repeats of the one sequence of word locations have been repeated, stepping the repeat counter and addressing a word location indicated by the address store to repeat the one sequence, and if the repeat counter has reached a state indicating that all repeats of the one sequence or word locations have been repeated, continuing to the next sequence and storing in the address store the address of the first word in the next sequence and setting the repeat counter to a state indicated by the at least one repeat number indicating output.

16. The method according to claim 15 above, further comprising the step of periodically addressing a starting word location in synchronism with the occurrence of video scanning frames for the digital video timing signal.

* * * * *